(12) United States Patent
Dou

(10) Patent No.: US 12,336,165 B2
(45) Date of Patent: Jun. 17, 2025

(54) MANUFACTURING METHOD OF SEMICONDUCTOR STRUCTURE AND SEMICONDUCTOR STRUCTURE WITH DIFFERENT FUNCTIONAL REGIONS

(71) Applicant: ChangXin Memory Technologies, Inc., Hefei (CN)

(72) Inventor: Tao Dou, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/908,298

(22) PCT Filed: Jul. 20, 2022

(86) PCT No.: PCT/CN2022/106600
§ 371 (c)(1),
(2) Date: Aug. 31, 2022

(87) PCT Pub. No.: WO2024/007367
PCT Pub. Date: Jan. 11, 2024

(65) Prior Publication Data
US 2024/0298434 A1  Sep. 5, 2024

(30) Foreign Application Priority Data
Jul. 5, 2022 (CN) .......................... 202210794531.7

(51) Int. Cl.
*H10B 12/00* (2023.01)

(52) U.S. Cl.
CPC ............. *H10B 12/05* (2023.02); *H10B 12/30* (2023.02)

(58) Field of Classification Search
CPC ........ H10B 12/00; H10B 12/05; H10B 12/30; H10D 48/30
See application file for complete search history.

(56) References Cited

U.S. PATENT DOCUMENTS

| | | | |
|---|---|---|---|
| 2020/0286901 A1* | 9/2020 | Shimomura | H10B 41/27 |
| 2021/0159244 A1* | 5/2021 | Xia | H10B 43/50 |
| 2022/0367683 A1* | 11/2022 | Chen | H10B 10/125 |
| 2023/0397400 A1* | 12/2023 | Tang | H10D 30/6757 |

FOREIGN PATENT DOCUMENTS

CN  11221631 A  1/2021

* cited by examiner

*Primary Examiner* — Wael M Fahmy
*Assistant Examiner* — Tiberiu Dan Onuta
(74) *Attorney, Agent, or Firm* — Kilpatrick Townsend & Stockton LLP

(57) ABSTRACT

The disclosed semiconductor structure includes a window region, a transistor region, and a step region arranged in a first direction. The transistor region includes a word line region and a window region. The method making the semiconductor structure includes: forming active layers at intervals, forming dummy word line structures in the word line region and the step region covering the active layers at the same layer; forming a first isolation layer which a main body part and an interval part connected together, wherein the main body part is located in the window region, and the interval is located in the word line region and the step region between adjacent dummy word line structures; removing the active layers from the step region, removing the dummy word line structures; and forming a dielectric layer in the step region and the word line region. The embodiments improve the semiconductor structure's performance.

15 Claims, 30 Drawing Sheets

MANUFACTURING METHOD OF SEMICONDUCTOR STRUCTURE AND SEMICONDUCTOR STRUCTURE WITH DIFFERENT FUNCTIONAL REGIONS

CROSS REFERENCES TO RELATED APPLICATIONS

This application claims the benefit of priority of Chinese patent application with the application Ser. No. 202210794531.7, entitled "Manufacturing Method of Semiconductor Structure and Semiconductor Structure", filed with the China National Intellectual Property Administration on Jul. 5, 2022, the contents of which are incorporated herein by reference in its entirety.

TECHNICAL FIELD

Embodiments of the present disclosure relate to the field of semiconductors, and in particular, relate to a semiconductor structure and the method for manufacturing it.

BACKGROUND

Dynamic Random Access Memory (DRAM) is a kind of semiconductor memory, which has the main function to store an amount of charges in a capacitor to represent whether a binary bit stored is 1 or 0.

A 3D stacked DRAM is a structure in which multiple layers of transistors are stacked on a substrate, and its integration level is high. Although it is beneficial to reduce the cost per unit area, however, the performance of current 3D stacked DRAMs has yet to be improved.

SUMMARY

Embodiments of the present disclosure provide a semiconductor structure and a method for manufacturing the semiconductor structure. The embodiments are conducive to improving the performance of the semiconductor structure.

According to some embodiments of the present disclosure, one aspect of the embodiments of the present disclosure provides a semiconductor structure, wherein the semiconductor structure includes: the semiconductor structure includes a window region, a transistor region and a step region sequentially arranged in a first direction, so the transistor region includes a word line region, the word line region is directly opposite to the window region and the step region, and the manufacturing method includes: providing a substrate, having a transistor region and a step region, a plurality of active layers arranged at intervals are formed on the substrate, and the active layer of the transistor region includes a plurality of active structures extending in a second direction, and the second direction is perpendicular to the first direction; the word line area and the step area form a plurality of dummy word line structures, and the dummy word line structures cover the active layer of the same layer; a first isolation layer is formed, and the first isolation layer includes connected a main body part and a spacer part, the main body part is located in the window area; the spacer part is located in the word line area and the step area, and is located between the adjacent dummy word line structures; the removal is located in the step area the active layer in the region; removing the dummy word line structure; forming a dielectric layer and a word line in the step region and the word line region, the dielectric layer covering the active structure; the word line covering the dielectric layer which covers the active structure of the same layer, and the word line is also located between the adjacent spacers.

According to some embodiments of the present disclosure, another embodiment of the present disclosure further provides a semiconductor structure, comprising: a window region, a transistor region and a step region sequentially arranged in a first direction, the transistor region including a word line region, the word line region is directly opposite and connected to the window region and the step region, the semiconductor structure further comprises: a substrate, and the substrate of the transistor region has a plurality of active layers arranged at intervals, the active layer of the transistor region includes a plurality of active structures extending in a second direction, the second direction being perpendicular to the first direction; a dielectric layer covering the surface of the active structures; a plurality of strips a word line, located in the word line area and the step area, and covering the active layer of the same layer; a first isolation layer, the first isolation layer includes a connected main body part and a spacer part in the main body. The spacer portion is located in the window region; the spacer portion is located in the word line region and the step region, and is located between adjacent word lines.

The embodiments of the present disclosure have provided at least the following advantages: forming a dummy word line structure covering the same active layer, and the space position occupied by the dummy word line structure is the space position occupied by the subsequently formed word lines; a first isolation layer is formed between adjacent dummy word line structures, after which the dummy word line structures are removed, and word lines are formed in the first isolation layer. That is, the first isolation layer can regulate the shape of the word line, so as to avoid the problem of disconnection of the same word line or interconnection of adjacent word lines. In addition, removing the active layer in the step region can avoid the adverse effect of its high resistance on the semiconductor structure, thereby helping to improve the performance of the semiconductor structure. In addition, the window region can increase the process window for forming the dummy word line structure and the first isolation layer, thereby facilitating process fabrication.

BRIEF DESCRIPTION OF THE DRAWINGS

The accompanying drawings, which are incorporated in and constitute a part of this specification, illustrate embodiments consistent with the disclosure, and together with the description serve to explain the principles of the disclosure. Obviously, the drawings in the following description are only some embodiments of the present disclosure, and for those of ordinary skill in the art, other drawings can also be obtained from these drawings without creative effort.

DETAILED DESCRIPTION OF THE PREFERRED EMBODIMENTS

Figure 1:
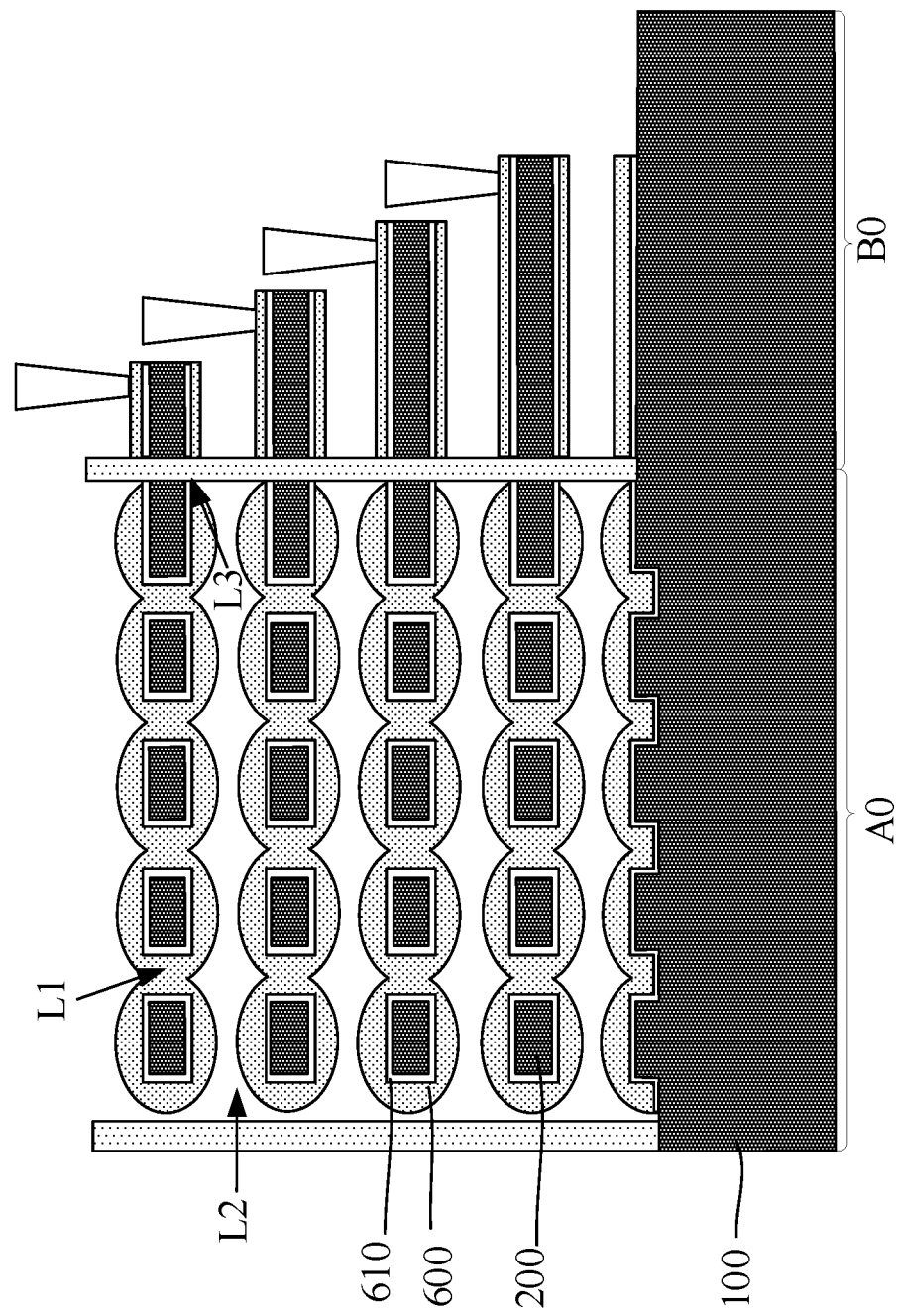
FIG. 1 shows the schematic diagram of a semiconductor structure.

Referring to FIG. 1, it is found through analysis that after the multilayer active structure 200 is formed on the substrate 100, a conductive material is usually directly deposited to form a word line 600 covering the multiple active structures 200 of the same layer; materials are deposited to varying degrees at different locations, allowing false interconnects or disconnects to occur. For example, at the first position L1, that is, at the edge of the active structure 200, the thickness of the word line 600 is small, and disconnection may occur. In the second position L2, since the upper and lower spaces are connected, the word lines 600 adjacent to the upper and lower layers are likely to be interconnected. At the third position L3, due to the blocking of the dielectric layer 610, the step region B0 is easily disconnected from the word line 600 in the word line region A0, so that the word line 600 in the word line region A0 cannot be drawn out. In addition, the active structure 200 in the step region B0 is also used to lead out the word line 600, but its resistance is relatively high. Therefore, the performance of the semiconductor structure needs to be improved.

An embodiment of the present disclosure provides a method for manufacturing a semiconductor structure, the manufacturing method comprising: forming a dummy word line structure covering an active layer of the same layer, and forming a first isolation layer between adjacent dummy word line structures, After that, the dummy word line structure is removed to expose the active layer, and a word line covering the same layer of the active layer is formed. That is, the space position occupied by the dummy word line structure is the space position occupied by the word line, and the first isolation layer is a mold for forming the word line, which can regulate the shape of the word line, thereby avoiding word lines between adjacent active structures. The line is disconnected; in addition, the first isolation layer has been formed before the word line is formed. Under the isolation effect of the first dielectric layer, the interconnection of the upper and lower word lines can be avoided; in addition, the active layer in the step area is removed, which can The adverse effect of its high resistance on the semiconductor structure is avoided, and the contact area between the word line in the word line region and the word line in the step region can be increased. Therefore, the performance of the semiconductor structure is improved. In addition, the window region can increase the process window for forming the dummy word line structure and the first isolation layer, thereby facilitating process fabrication.

The embodiments of the present disclosure will be described in detail below in conjunction with the accompanying drawings. However, those of ordinary skill in the art can appreciate that, in the various embodiments of the present disclosure, many technical details are provided for the reader to better understand the embodiments of the present disclosure. However, even without these technical details and various changes and modifications based on the following embodiments, the technical solutions claimed in the embodiments of the present disclosure can be implemented.

As shown in FIGS. 2 to 30, an embodiment of the present disclosure provides a method for fabricating a semiconductor structure. It should be noted that, in order to facilitate description and clearly illustrate the steps of the method for fabricating a semiconductor structure, FIG. 2 to FIG. 30 show the schematic structure diagrams corresponding to each major step of the manufacture method for the semiconductor structure.

Figure 2:
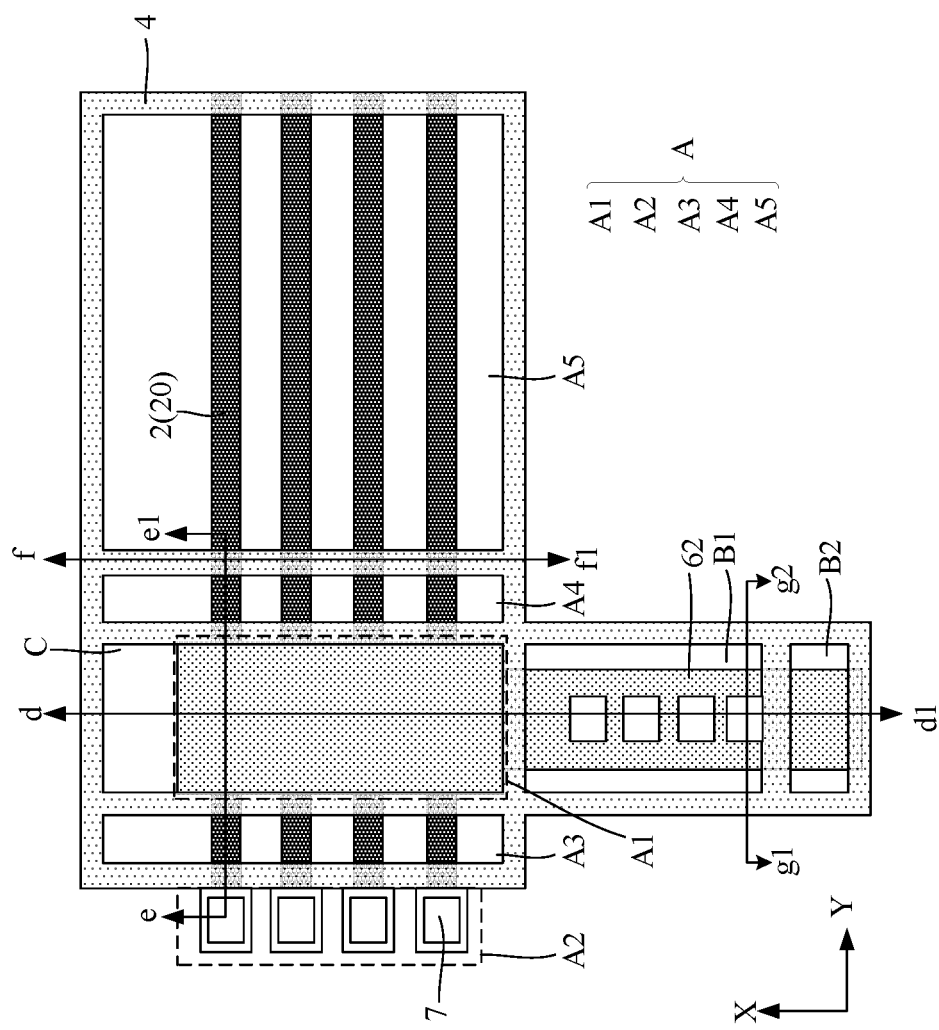
FIG. 2-FIG. 30 show the schematic structure diagrams corresponding to each major step of the manufacture method for the semiconductor structure.

Referring to FIG. 2, FIG. 2 shows a top view of the semiconductor structure formed finally, and for more intuitiveness, only a part of the semiconductor structure is shown in the top view. First, it should be noted that the semiconductor structure has a first direction X, a second direction Y and a third direction Z (refer to FIG. 3). The first direction X and the second direction Y are parallel to the surface of the substrate 1 and they are perpendicular to each other, and the third direction Z is perpendicular to the surface of the substrate 1.

The semiconductor structure includes a window area C, a transistor area A and a step area B arranged in sequence in the first direction X, the transistor area A includes a word line area A1, and the word line area A1 is directly opposite to the window area C and the step area B and connected. In some embodiments, the step area B includes a first area B1 and a second area B2, and the first area B1 is located between the word line area A1 and the second area B2.

The manufacturing method will be described in detail below in conjunction with accompanying drawings.

Figure 3:
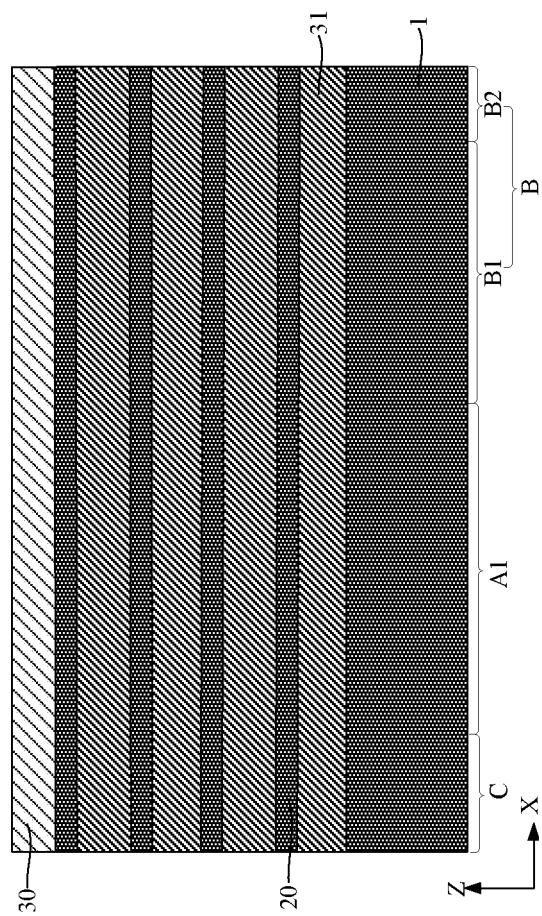
Figure 4:
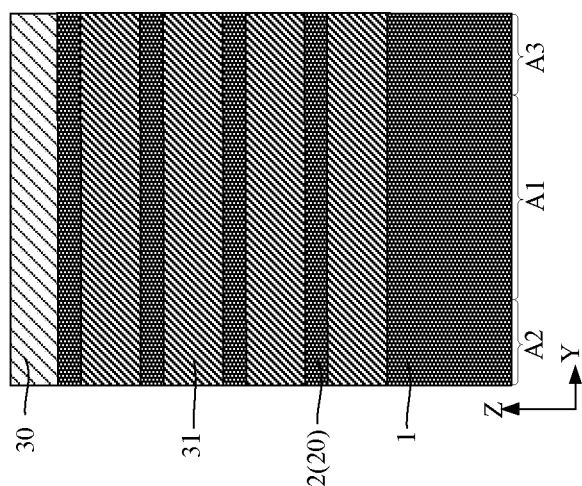
Figure 5:
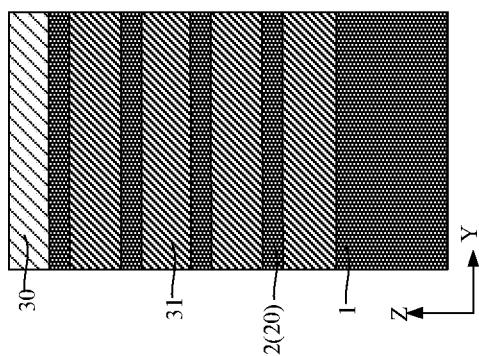

FIG. 3 is the cross sectional view on the d-d1 line shown in FIG. 2; FIG. 4 is the cross sectional view on the e-e1 line and f-f1 line shown in FIG. 2; FIG. 5 shows cross sectional view on the g-g1 line in FIG. 2. Referring to FIGS. 3-5, a substrate 1 is provided, and a plurality of alternately arranged active layers 20 and sacrificial layers 31 are formed on the substrate 1. In the illustrations, the active layer 20 and the sacrificial layer 31 are formed through an epitaxial growth process. For example, the material of the active layer 20 and the substrate 1 are the same, both of which may be silicon layers, and the material of the sacrificial layer 31 may be silicon germanium.

In addition, the protective layer 30 may also be formed on the surface of the active layer 20. For example, silicon oxide is deposited on the surface of the active layer 20 as the protective layer 30. The protective layer 30 can protect the surface of the active layer 20 in the subsequent etching process.

Figure 6:
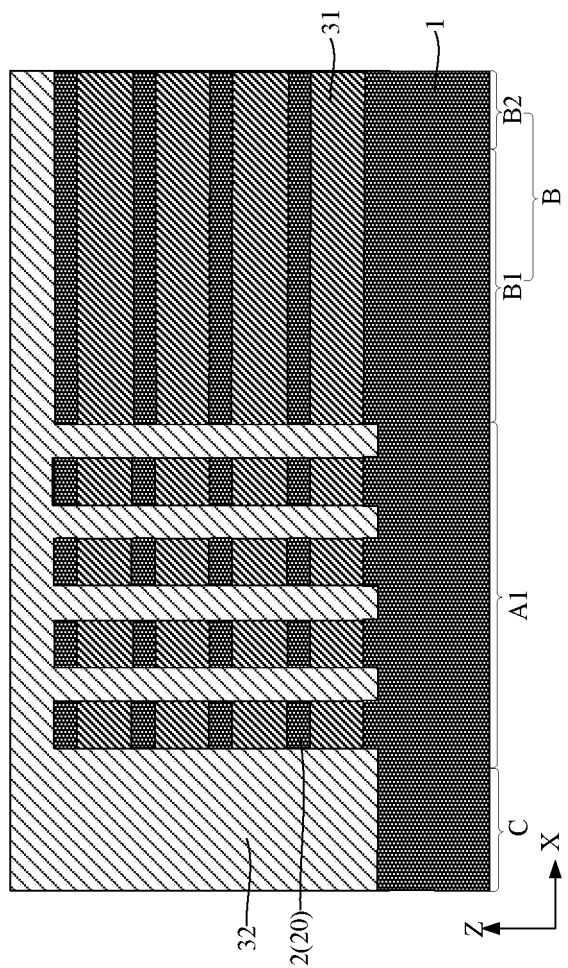
Figure 7:
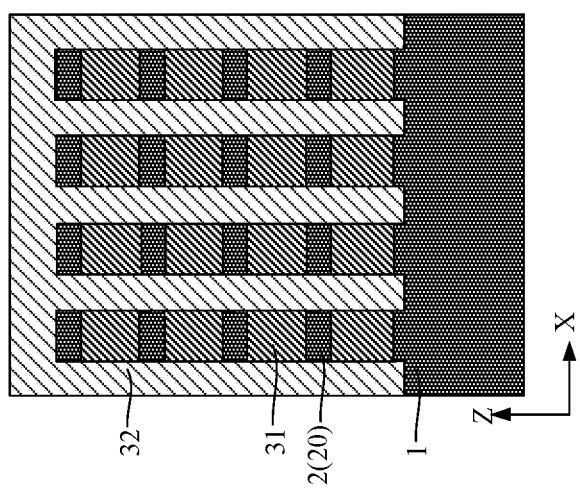
Figure 8:
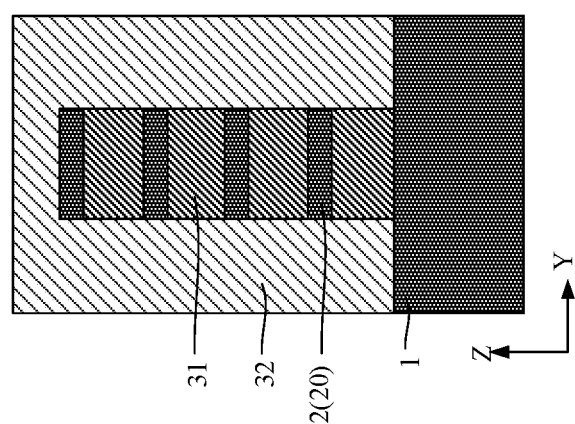

With reference to FIG. 6-FIG. 8, FIG. 6 is the cross sectional view on the d-d1 line shown in FIG. 2, FIG. 7 is the cross sectional view in the f-f1 line shown in FIG. 2, FIG. 8 is the cross sectional view in the g-g1 line shown in FIG. 2; in this step, the cross-section of the semiconductor structure along the line of e-e1 does not change, please refer to FIG. 4; the second isolation layer 32 is formed, and the second isolation layer 32 penetrates the active layer 20 and sacrificial layer 31. Specifically, referring to FIGS. 6-7, the second isolation layer 32 is located in the transistor region A and the window region C, and divides the active layer 20 of the transistor region A into a plurality of active structures 2 and fills the window region C. In some embodiments, referring to FIG. 8, the second isolation layers 32 are also located on opposite sides of the step region B arranged in the second direction Y.

By way of example, the active layer 20 and the sacrificial layer 31 are patterned to remove the active layer 20 and the sacrificial layer 31 in the window region C, and a trench is formed in the transistor region A and the step region B. The trenches in the transistor region A extend along the second direction Y; the trenches in the step region B extend along the first direction X. An insulating material is deposited in the trenches of the window region C and the transistor region A as the second isolation layer 32. The material of the second isolation layer 32 may be the same as the material of the protective layer 30, for example, both are silicon oxide.

Figure 9:
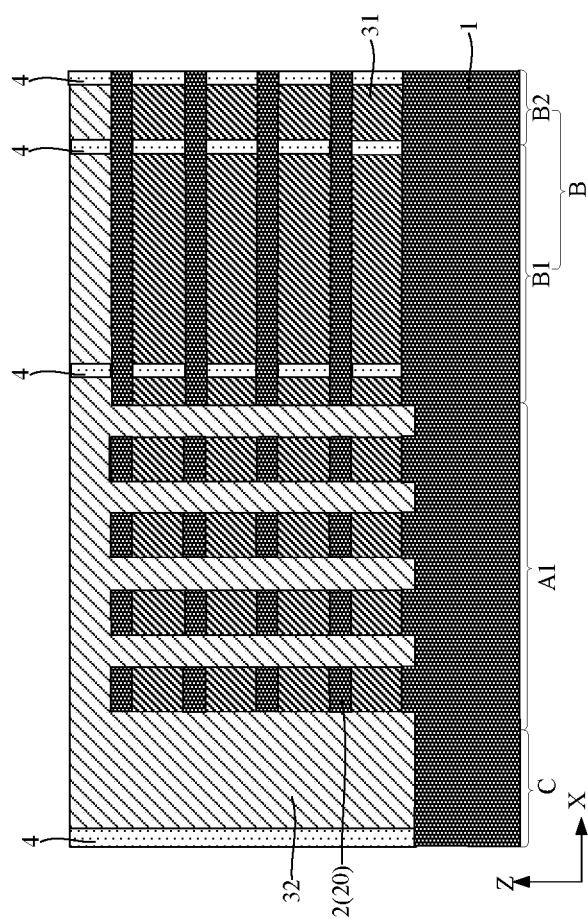
Figure 10:
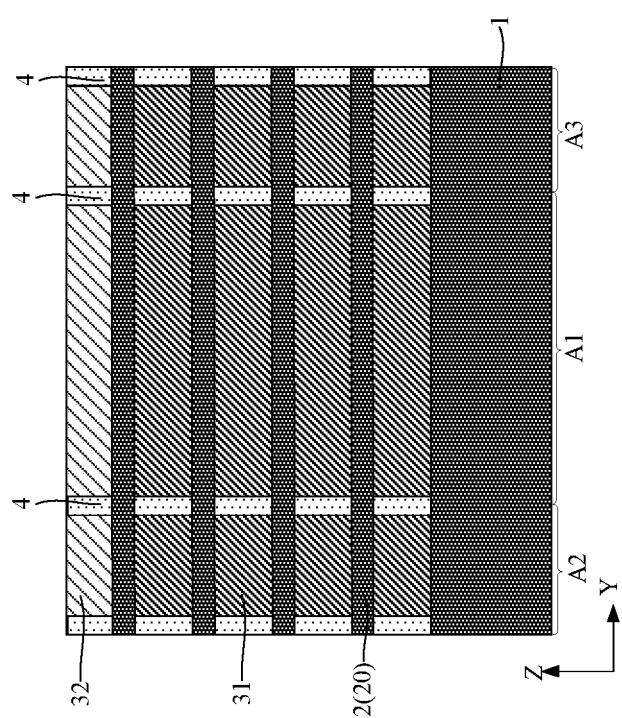
Figure 11:
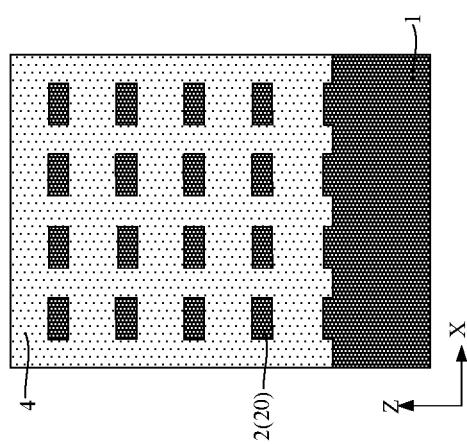
Figure 12:
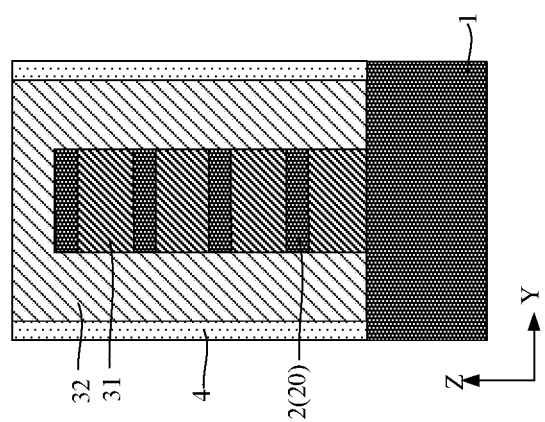

FIG. 9 is the cross sectional view along the d-d1 line shown in FIG. 2, FIG. 10 is the cross sectional view along the e-e1 line shown in FIG. 2, FIG. 11 is the cross sectional view along the f-f1 line shown in FIG. 2 FIG. 12 is a cross-sectional view along the g-g1 line shown in FIG. 2; with reference to FIGS. 9-12, a support structure 4 is formed. For example, a dry etching process is used to remove part of the second isolation layer 32 and part of the sacrificial layer 31 to form a plurality of trenches, and silicon nitride is deposited in the trenches to serve as the support structure 4.

Specifically, referring to FIG. 9, the support structure 4 is located at least at the junction of the first region B1 and the second region B2, and covers the active layer 20. It should be noted that the structure in the second region B2 will be removed to provide a process window later. To avoid this process from affecting the firmness of the structure in the first region B1, a support structure 4 may be formed to provide support. In addition, in the subsequent process of removing the sacrificial layer 31, the support structure 4 here can also provide support for the active layer 20 in the step region B to prevent the active layer 20 from collapsing.

Continuing to refer to FIG. 9, in some embodiments, the support structure 4 is also located on a side of the second region B2 away from the first region B1, and covers the active layer 20. That is, the support structure 4 here is a mesh structure, and the active layer 20 penetrates the support structure 4. In the subsequent process of removing the sacrificial layer 31, the support structure 4 here can avoid the collapse of the active layer 20 in the second region B2.

Continuing to refer to FIG. 9, in some embodiments, the support structure 4 is also located at the junction of the word line region A1 and the first region B1, and covers the active layer 20. That is, the support structures 4 are formed on both sides of the first region B1, so that the firmness of the active layer 20 of the first region B1 can be improved. The greater the firmness of the active layer 20, the more stable the spacer 52 formed subsequently.

Referring to FIG. 2 and FIG. 9, the support structure 4 is also located at the edge of the window region C that is not in contact with the word line region A1, and the support structure 4 also penetrates the second isolation layer 32. That is, the support structure 4 can define the shape and position of the window area C. In some embodiments, three sides of the window area C are not in contact with the word line area A1. The reason why the support structure 4 is not formed at the edge of the window region C and the word line region A1 is that the side of the word line region A1 facing the window region C is exposed, and the subsequent reaction gas can enter the word line region A1 from this side to form the spacer 52.

Referring to FIG. 10, in other embodiments, the support structure 4 is also located on opposite sides of the word line region A1 arranged in the second direction Y, and the support structure 4 also covers the active structure 2. That is to say, the support structure 4 is a mesh structure, which can cover each active structure 2, and the active structure 2 passes through the support structure 4 in the second direction Y.

In addition, the support structure 4 may also be located on the side of the first interval region A3 far away from the word line region A1, and the second interval region A4 on the side of the word line region A1 away from the word line region A1, so that the active structure 2 of the first interval region A3 and the second interval region A4 is supported.

Referring to FIG. 12, the support structure 4 is also located on opposite sides of the step area B arranged in the second direction Y. That is to say, the support structure 4 here is used to define the boundary of the process window of the step area B. The greater the distance between the support structure 4 and the active layer 20 in the step area B, the larger the process window of the step area B. The subsequent formation of the spacer portion 52 can be facilitated.

Figure 13:
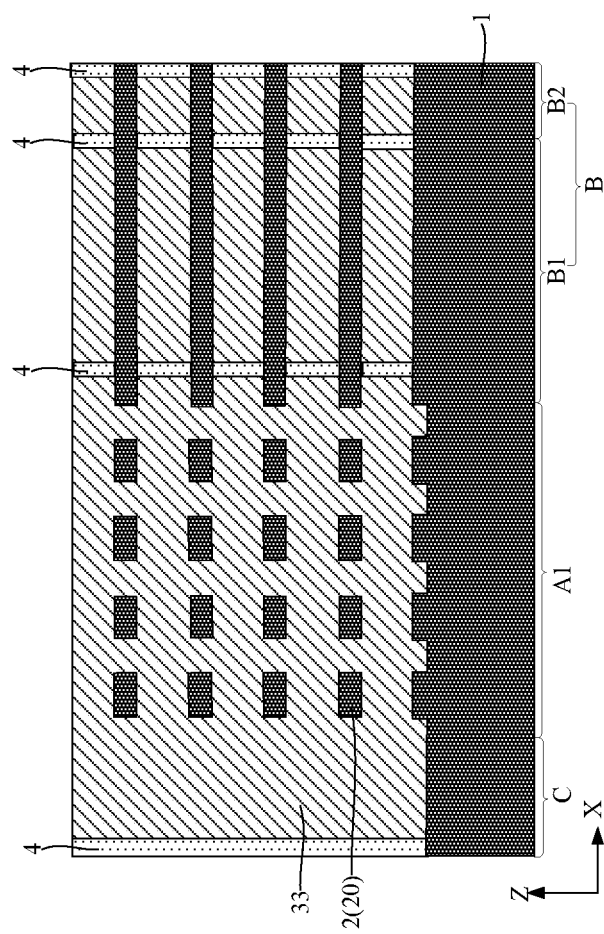
Figure 14:
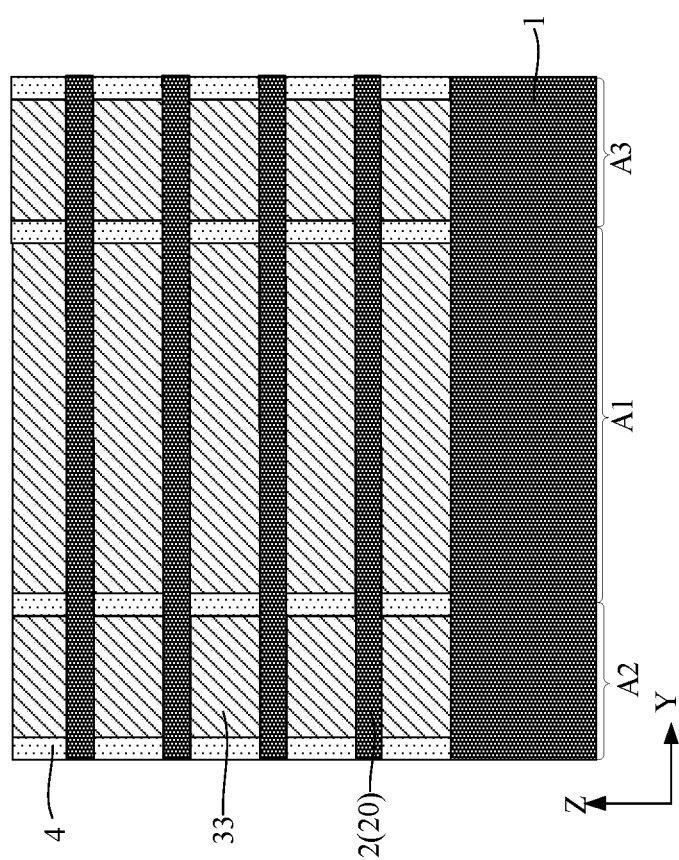
Figure 15:
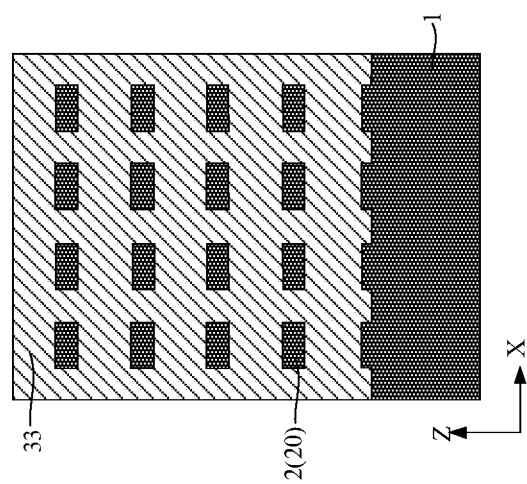
Figure 16:
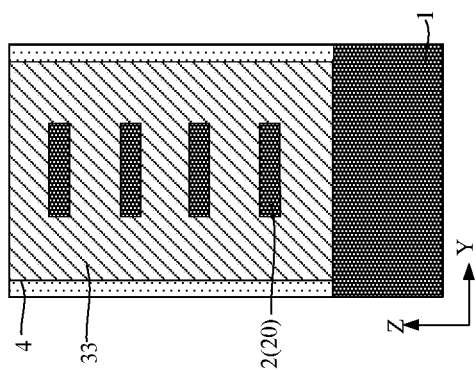

FIG. 13 is a cross-sectional view along line of d-d1 shown in FIG. 2, FIG. 14 is a cross-sectional view along the line of e-e1 shown in FIG. 2, and FIG. 15 is a cross-section along the line of f-f1 shown in FIG. 2 FIG. 16 is a cross-sectional view along the g-g1 line shown in FIG. 2. With reference to FIGS. 13-16, after the support structure 4 is formed, the sacrificial layer 31 and the second isolation layer 32 are removed. In some embodiments, all the sacrificial layers 31 can be removed at one time; in other embodiments, the sacrificial layers 31 can also be removed multiple times for different regions, for example, the sacrificial layers of the step region B and the word line region A1 can be removed first layer 31, and the sacrificial layer 31 in other regions is removed in subsequent process steps.

Continue to refer to FIGS. 13-16, a filling layer 33 is formed, the filling layer 33 covers the active layer 20, and is in contact with the support structure 4, and the filling layer 33 is also filled in the window region C. That is, the filling layer 33 occupies the original space of the sacrificial layer 31 and the second isolation layer 32, and the transistor region A, the step region B and the window region C all have the filling layer 33. For example, the material of the filling layer 33 may be the same as the material of the protective layer 30 and the second isolation layer 32, such as silicon dioxide.

Figure 17:
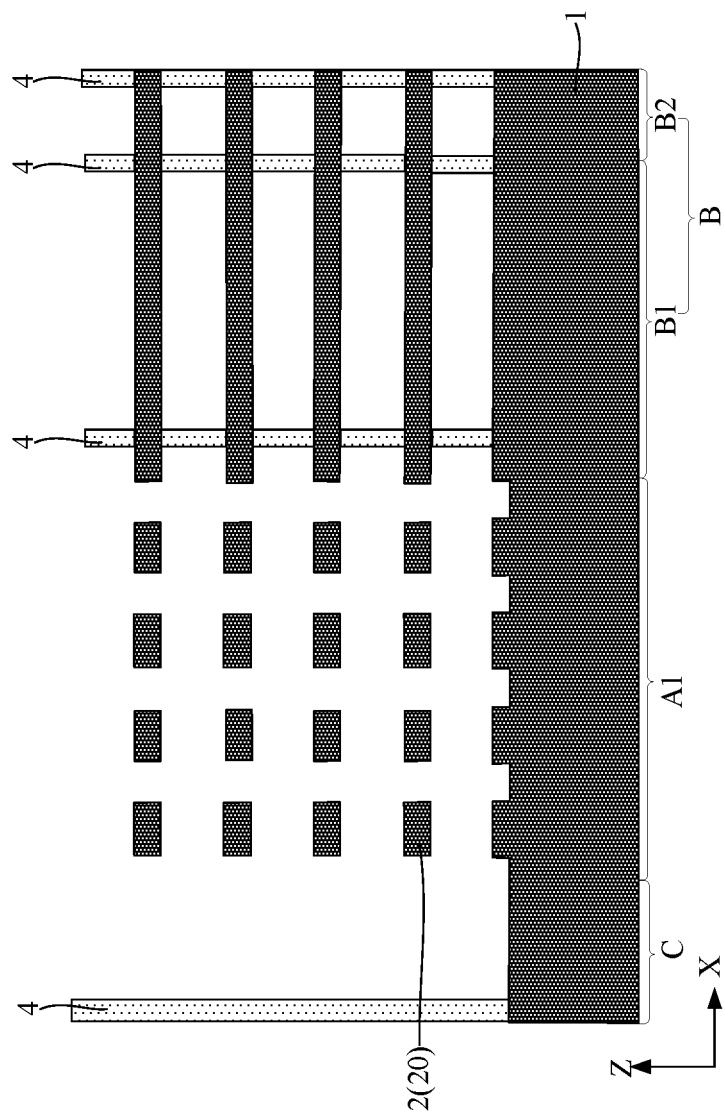
Figure 18:
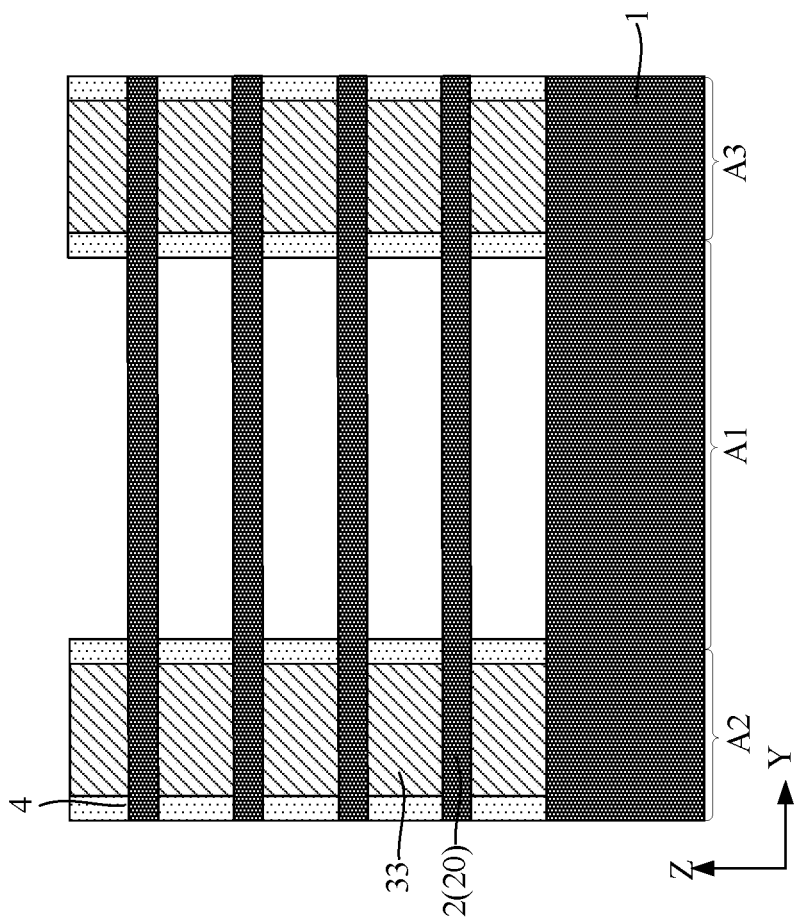

Refer to FIGS. 17 and 18, the filling layer 33 located in the word line region A1, the step region B and the window region C is removed, thereby exposing the active layer 20.

So far, based on FIG. 3-FIG. 18, a plurality of active layers 20 arranged at intervals can be formed on the substrate 1 of the transistor region A and the step region B, and the active layer 20 of the transistor region A includes a plurality of active layers 20 in the second active structure 2 extending in direction Y. The above steps are only illustrative, and the embodiments of the present disclosure are not limited thereto. For example, after the support structure 4 is formed, only the second isolation layer 32 and the sacrificial layer in the word line region A1, the step region B, and the window region C may be removed. 31, thereby forming a multi-layer spaced active layer 20. Since the sacrificial layer 31 in other areas has not been removed, there is no need to form the filling layer 33

Figure 19:
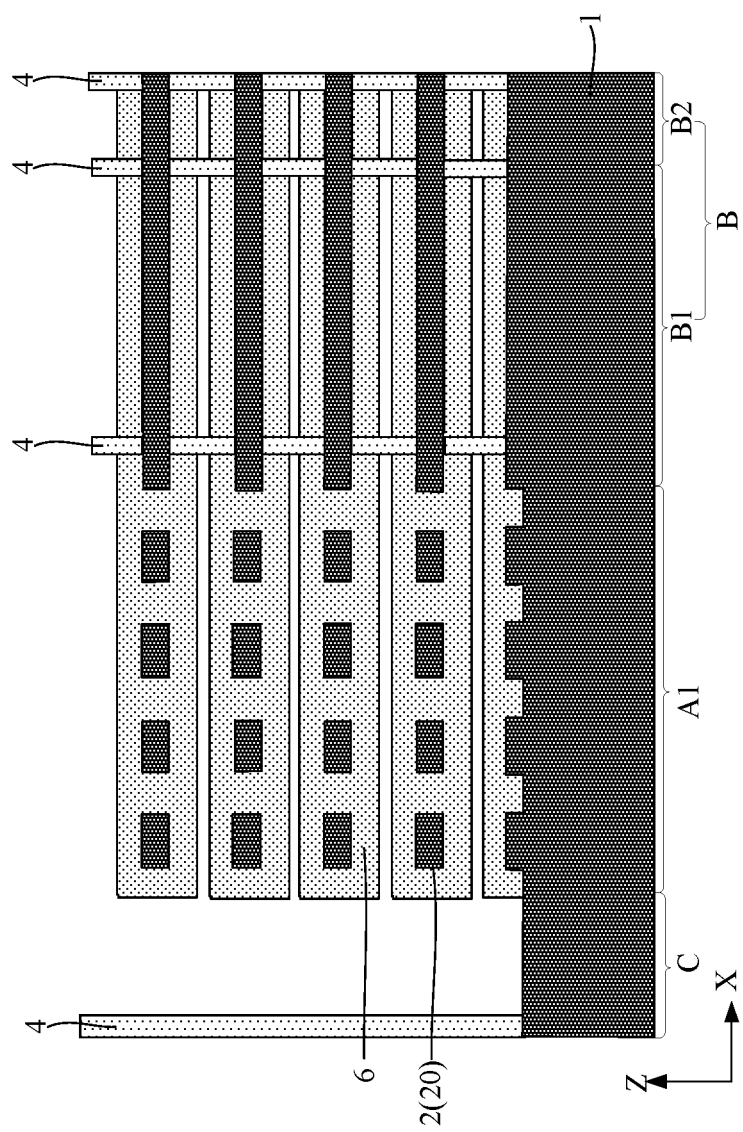
Figure 20:
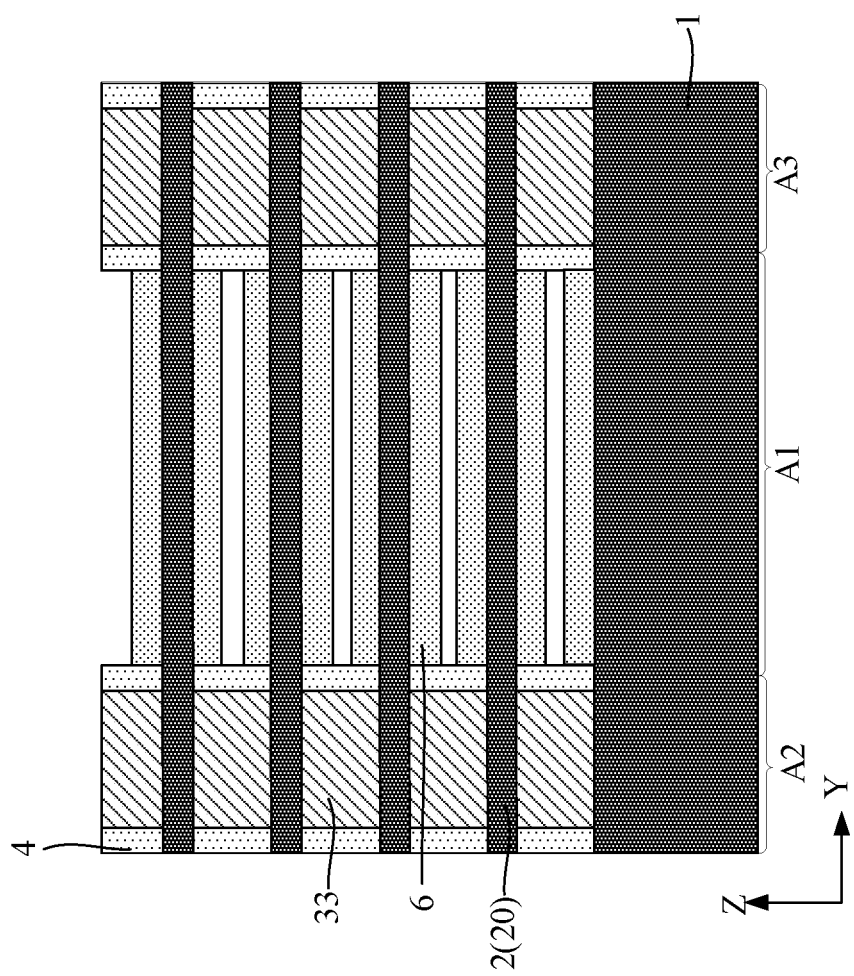

FIG. 19 is a cross-sectional view along the line of d-d1 shown in FIG. 2, and FIG. 20 is a cross-sectional view along the line of e-e1 shown in FIG. 2, with reference to FIGS. 19-20, a plurality of dummy word line structures 6 are formed in the region B, and the dummy word line structures 6 cover the active layer 20 of the same layer.

Illustratively, silicon oxide is deposited on the surface of the active layer 20 by an atomic layer deposition process to serve as the dummy word line structure 6. The atomic layer deposition process deposits substances on the surface of the active structure 2 in the form of a single atomic film layer by layer. During the atomic layer deposition process, the chemical reaction of the new layer of atomic film is directly related to the previous layer, so, the uniformity and density of the film layer are better, which is beneficial to improve the morphology of the dummy word line structure 6. The spatial position where the dummy word line structure 6 is located is the spatial position where the subsequently formed dielectric layer 61 and the word line 62 are located. Therefore, the shape of the subsequently formed word line 62 can also be improved. In other embodiments, the dummy word line structure 6 may also be formed by a chemical vapor deposition process.

It should be noted that, because one side of the word line area A1 is provided with a window area C, the window area C is used to increase the process window, that is, to increase the amount of reactive gas entering into the dummy word line structure 6 of the word line area A1 and the step area B, so that the deposition degree of the reactive gas on the surface of the active structure 2 is relatively consistent. In addition, both sides of the step region B also have larger process windows, so that the deposition process of the reactive gas can also be promoted.

Figure 21:
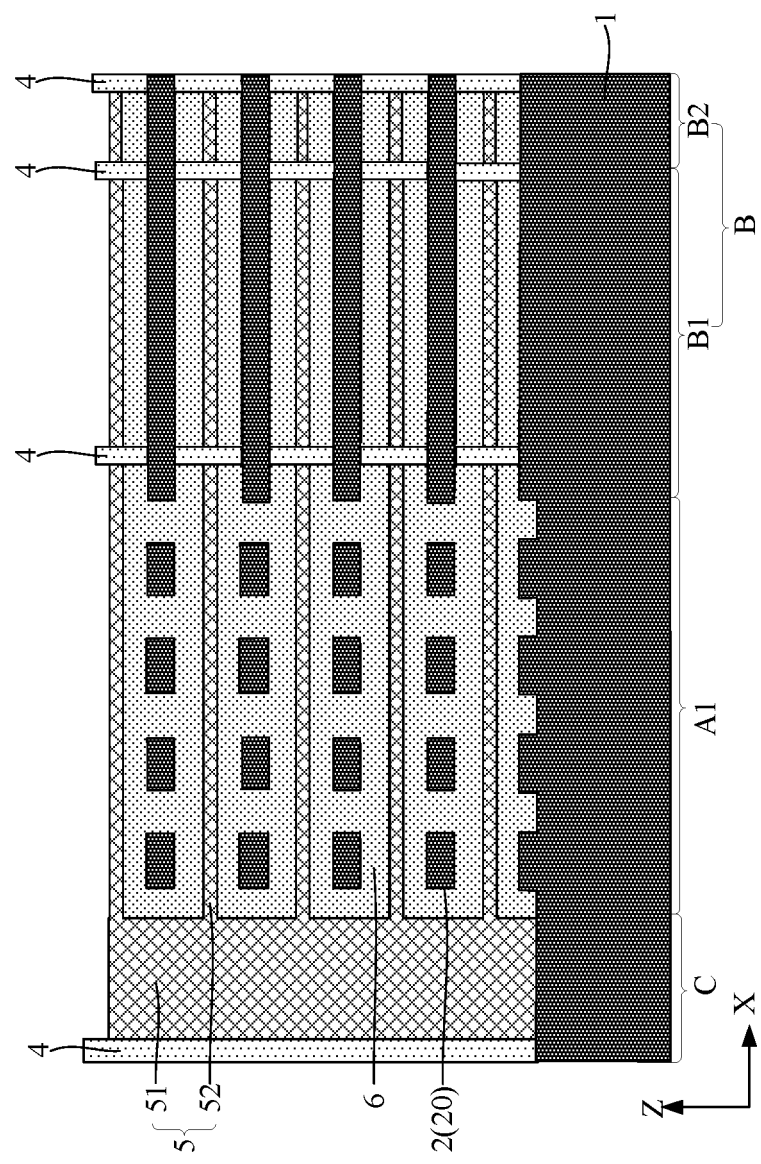
Figure 22:
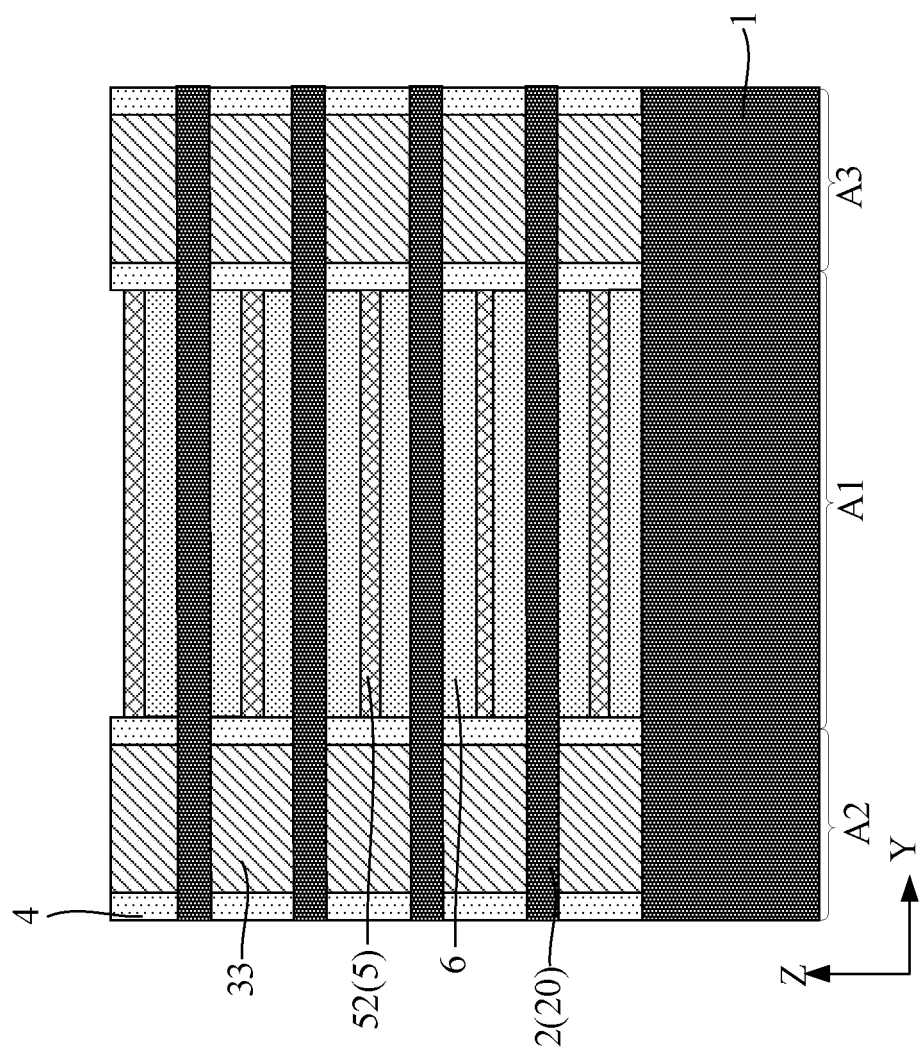

FIG. 21 is a cross sectional view along the line of d-d1 shown in FIG. 2, FIG. 22 is a cross sectional view along the line of e-e1 shown in FIG. 2, with reference to FIGS. 21-22, the first isolation layer 5 is formed, the first isolation layer 5 includes a connected main body portion 51 and a spacer portion 52. The main body portion 51 is located in the window region C; the spacer portion 52 is located in the word line region A1 and the step region B, and is located between adjacent dummy word line structures 6. That is, the reverse filling process is used to form the first isolation layer 5 as an isolation structure between the upper and lower layer word lines 62 to be formed subsequently.

It should be noted that the main body portion 51 can support the spacer portion 52 in the subsequent process of removing the dummy word line structure 6, thereby improving the firmness of the spacer portion 52. In addition, the first isolation layer 5 serves as a mold for the subsequent formation of the word lines 62, and can control the shape and size of the word lines 62.

As in the lustration, silicon nitride is deposited on the window region C, the word line region A1 and the step region B as the first isolation layer 5 by an atomic layer deposition process. The atomic layer deposition process can improve the density and uniformity of the first isolation layer 5, thereby helping to improve the isolation effect, and can also improve the morphology of the subsequently formed word lines 62. In other embodiments, the first isolation layer 5 may also be formed by a chemical vapor deposition process.

In some embodiments, in the first direction X, the width of the window region C is greater than the width of the second region B2. It should be noted that the second region B2 plays a role in increasing the process window during the subsequent removal of the dummy word line structure 6 and the active layer 20 of the first region B1; the window region C is used to form the dummy word line structure 6. During the process of making the first isolation layer 5, the process window is enlarged. In addition, the window region C also needs to accommodate the main body portion 51. Therefore, in order to improve the space utilization rate of the semiconductor structure and take into account the functions of each region, the width of the window region C in the first direction X can be appropriately increased, thereby enhancing the supporting effect of the main body portion 51 on the spacer portion 52.

The larger process window can promote the reactive gas deposition process, thereby improving the density of the first isolation layer 5, avoiding the generation of voids or gaps between the adjacent dummy word line structures 6, thereby improving the first isolation layer 6's shape, and improve the isolation effect of the first isolation layer 5.

Figure 23:
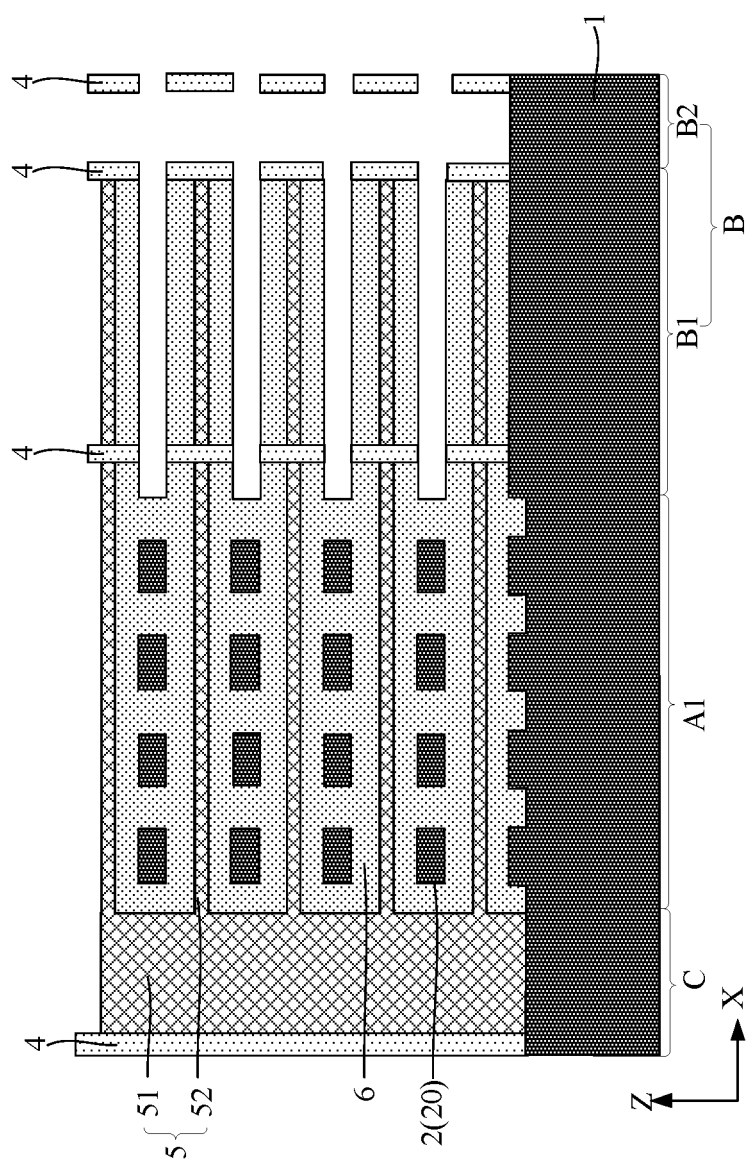

FIG. 23 is a cross sectional view along the line of d-d1 shown in FIG. 2. Referring to FIG. 23, the active layer 20, the spacer 52 and the dummy word line structure 6 located in the second region B2 are removed to expose the second region B2. The active layer 20 of a region B1.

For example, dry etching is used to remove the above-mentioned structures in the second region B2. After the above structures in the second region B2 are removed, a larger process window can be provided for the subsequent removal of the active layer 20 and the dummy word line structure 6 in the first region B1 and the subsequent formation of the word lines 62. That is, more etchant or reactive gas can enter the first region B1 and the word line region A1 through the second region B2, thereby improving the subsequent production efficiency and ensuring the quality of the first isolation layer 5 and the word line 62.

In some embodiments, in the first direction X, the width of the first region B1 is greater than the width of the second region B2. The main reason is that the word line 62 formed in the first region B1 is used to lead out the word line 62 of the word line region A1, that is, the first region B1 needs to accommodate multiple steps, while the second region B needs to accommodate multiple steps. The word lines 62 will be removed during the step forming process. In order to ensure that the first area B1 has sufficient accommodation space, the width of the first area B1 in the first direction X may be correspondingly increased.

Continuing to refer to FIG. 23, the active layer 20 located in the first region B1 is removed to expose the dummy word line structure 6.

Illustratively, wet etching is used to remove the active layer 20. Since the active layer 20 in the step region B is all removed, it is no longer used as a contact structure for the lead-out word line 62, therefore, the influence of the high resistance of the active layer 20 on the semiconductor structure can be avoided. In addition, after the active layer 20 is removed, a larger area of the dummy word line structure 6 can be exposed, so as to facilitate the subsequent removal of the dummy word line structure 6. In addition, after the active layer 20 is removed, a larger opening can be formed at the junction of the step region B and the word line region A1 to facilitate the interconnection of the word lines 62 in the subsequent two regions.

So far, based on the two steps shown in FIGS. 22-23, the active layer 20 located in the step region B can be removed. Removing the active layer 20 in two steps can improve process efficiency and reduce residues. The above steps are exemplary, and in other embodiments, the step area B may not be divided into the first area B1 and the second area B2, and the active layer 20 of the step area B may be removed directly by one process step.

Figure 24:
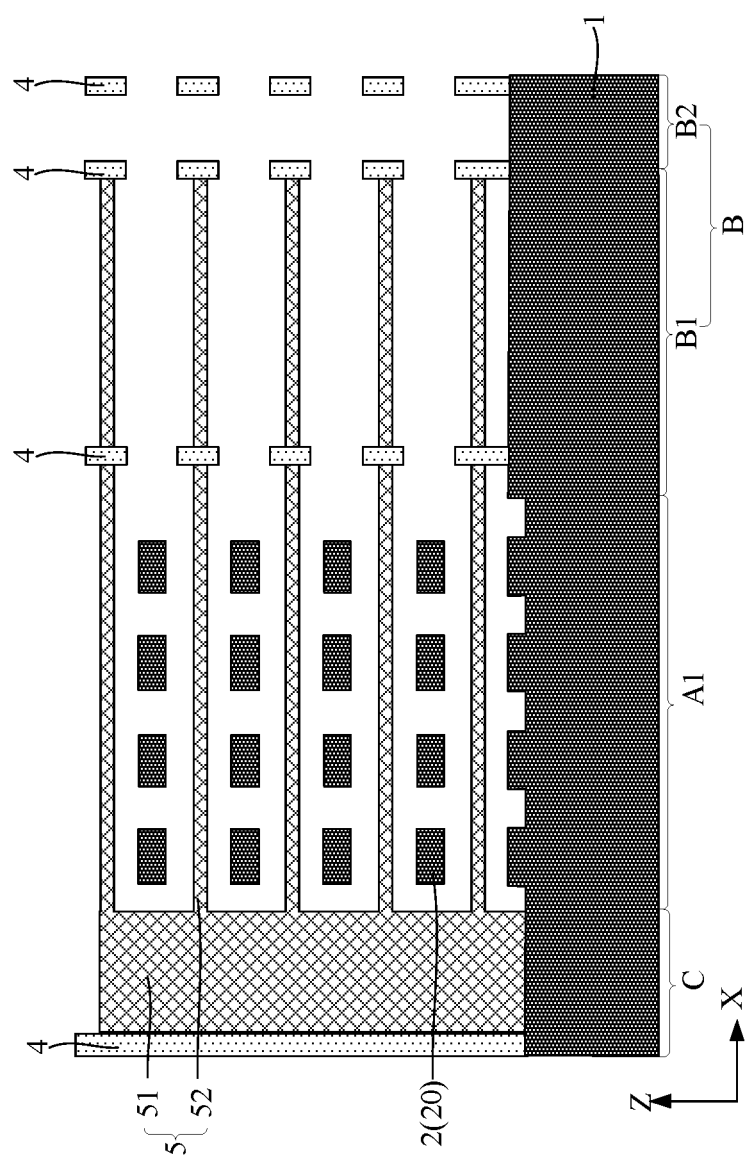
Figure 25:
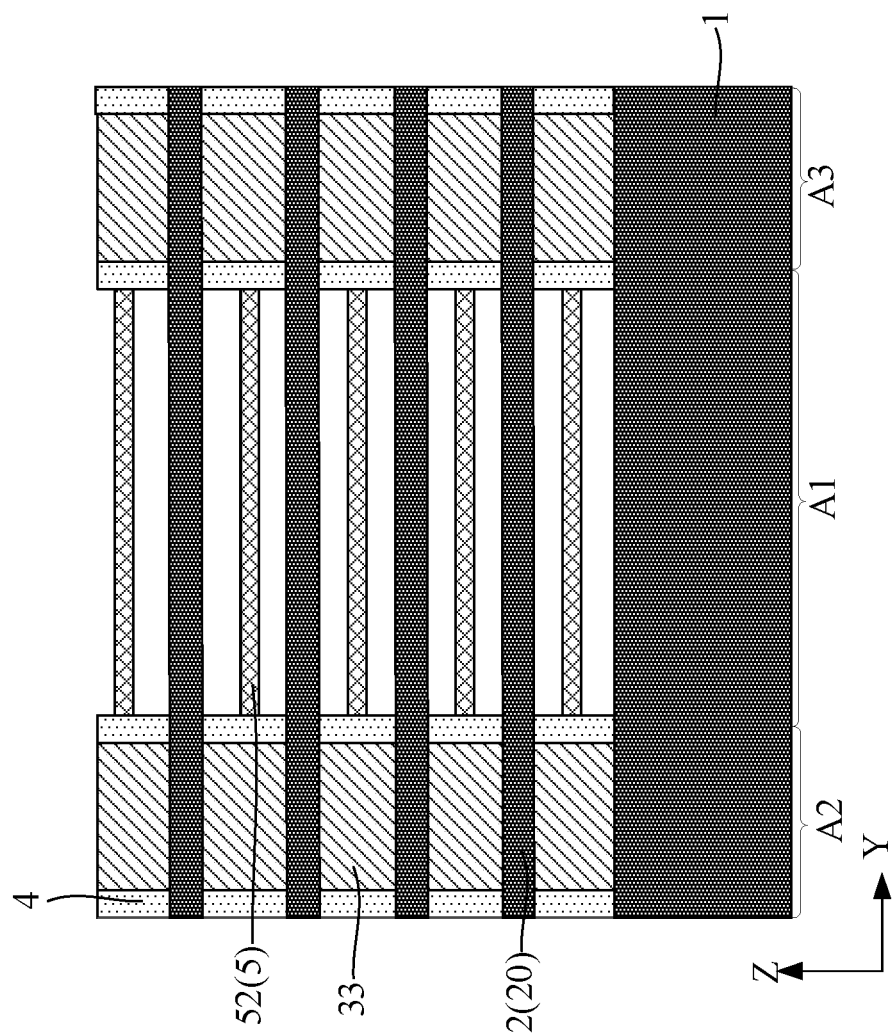

FIG. 24 is a cross-sectional view along the line of d-d1 shown in FIG. 2, and FIG. 25 is a cross-sectional view along the line of e-e1 shown in FIG. 2. Referring to FIGS. 24-25, the remaining dummy word lines are removed Structure 6. That is, the dummy word line structures 6 of the first region B1 and the word line region A1 are removed to expose the active structure 2.

By the illustration, wet etching is used to remove the dummy word line structures 6. In the process of removing the dummy word line structure 6, the selective etching ratio of the dummy word line structure 6 and the first isolation layer 5 is greater than 2:1. That is, a larger selective etching ratio can ensure that the damage to the first isolation layer 5 is reduced while the dummy word line structure 6 is removed, thereby ensuring the isolation effect of the first isolation layer 5 and avoiding affecting the subsequent formation of the word line 62. appearance.

So far, based on the two steps shown in FIG. 22 and FIG. 24-FIG. 25, the dummy word line structure 6 can be removed. It should be noted that removing the dummy word line structure 6 in two steps can improve process efficiency and reduce residues. The above steps are illustrative, and in other embodiments, the dummy word line structure 6 may be removed directly by one process step.

Figure 26:
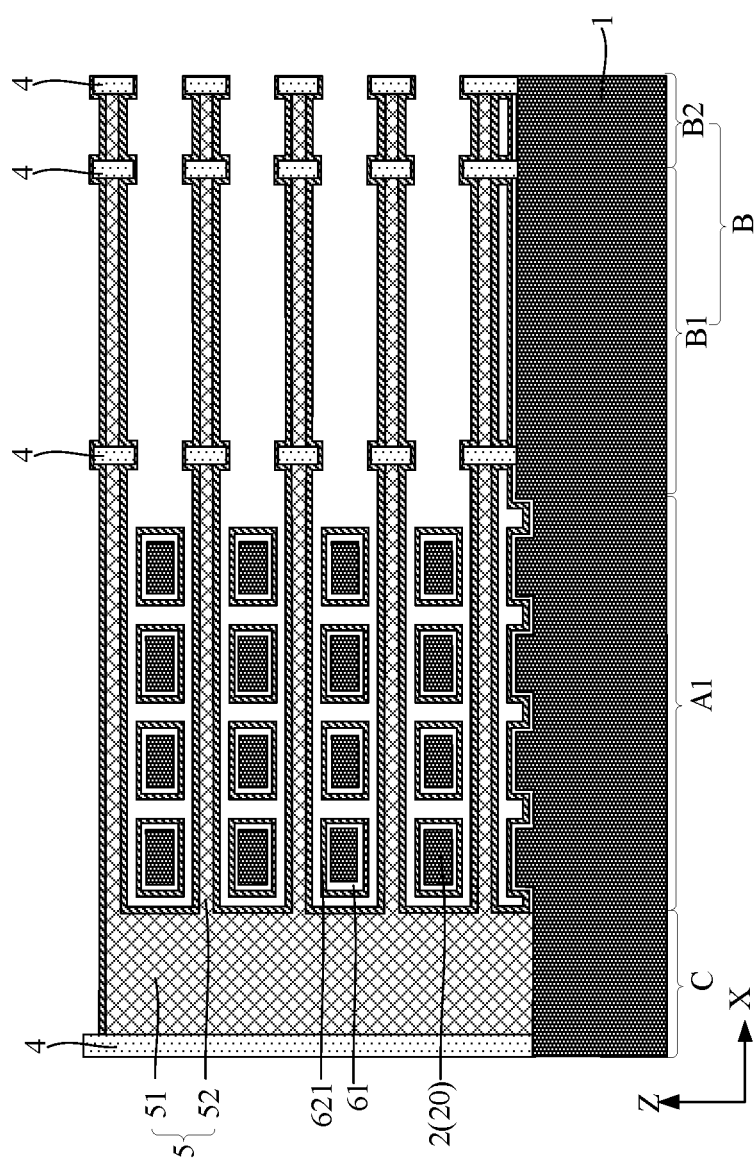

FIG. 26 is a cross-sectional view along the line of d-d1 shown in FIG. 2. Referring to FIG. 26, a dielectric layer 61 is formed in the step region B and the word line region A1, and the dielectric layer 61 covers the active structure 2. Illustratively, silicon oxide is grown on the surface of the active structure 2 to serve as the dielectric layer 61 through an in-situ water vapor generation process.

Continuing to refer to FIG. 26, a word line barrier layer 621 is formed on the surfaces of the dielectric layer 61 and the first isolation layer 5. For example, a film layer such as titanium nitride or tantalum nitride is formed on the surface of the dielectric layer 61 by an atomic layer deposition process to serve as the word line barrier layer 621. The word line barrier layer 621 can avoid atomic diffusion between the word line filling layer 622 and the first isolation layer 5 formed subsequently, thereby ensuring that the word line filling layer 622 has a lower resistance.

Figure 27:
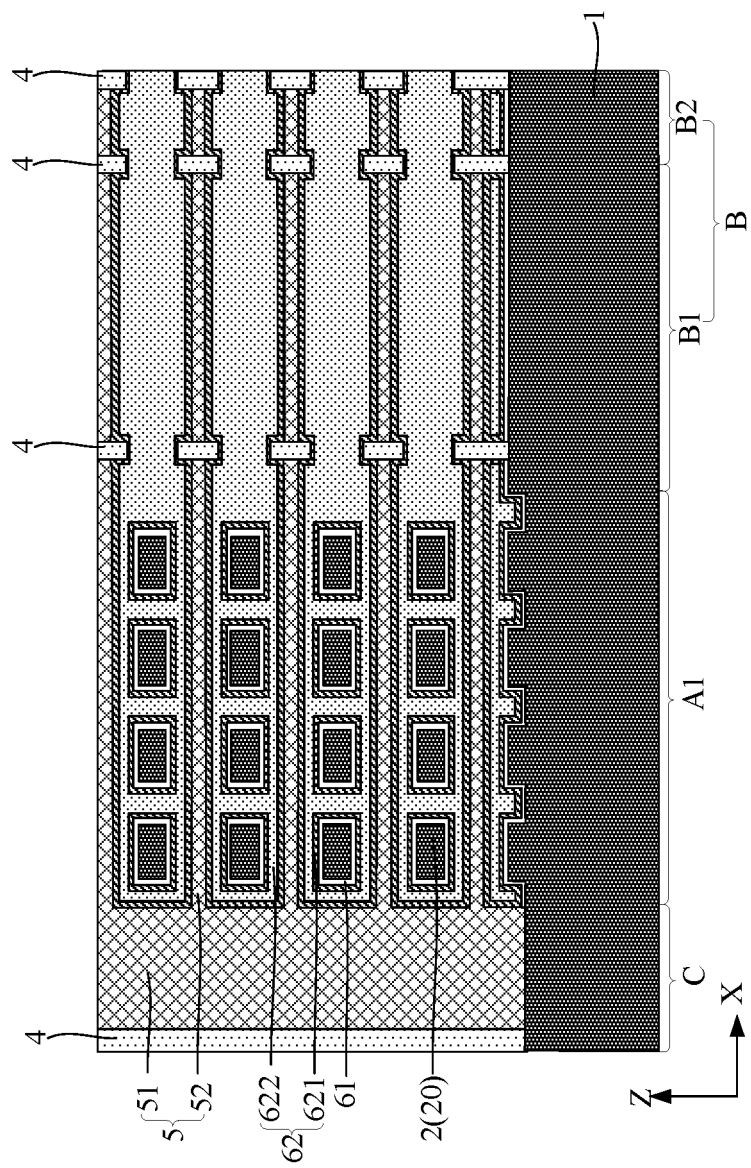
Figure 28:
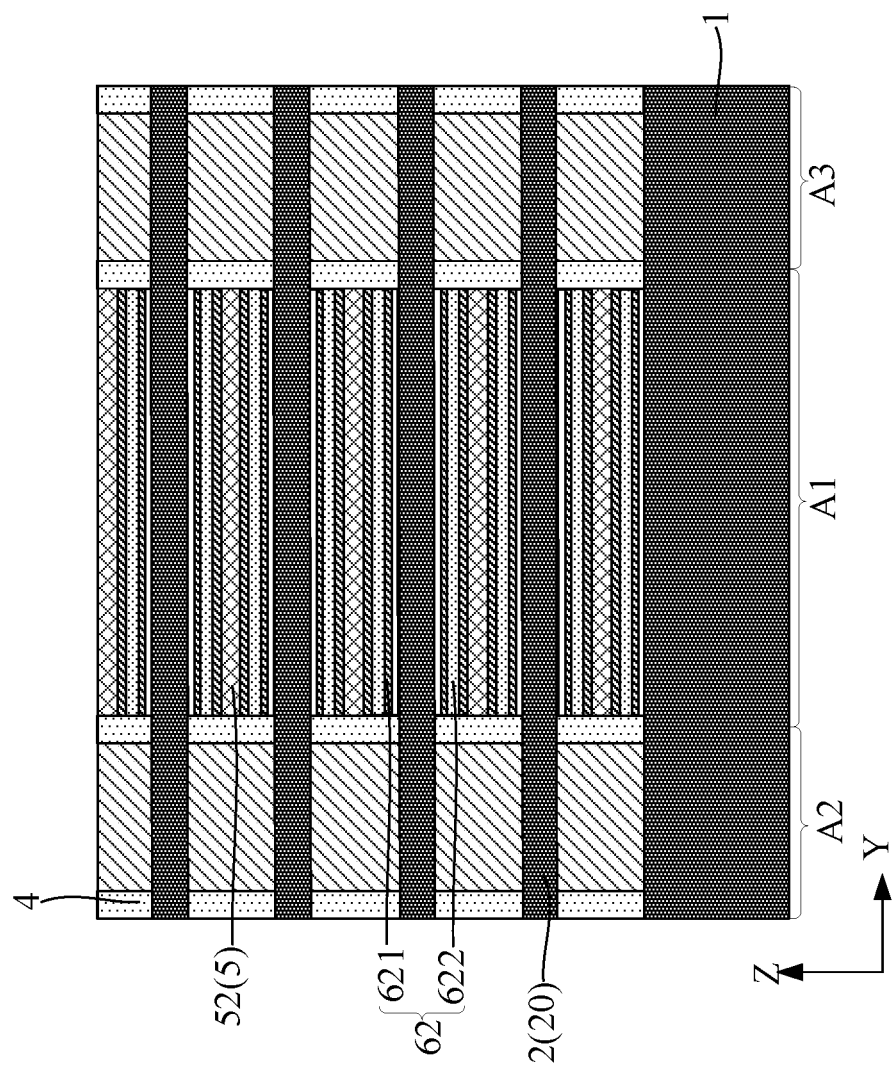

With reference to FIG. 27-FIG. 28, FIG. 27 is a cross sectional view along the line of d-d1 shown in FIG. 2, FIG. 28 is a cross sectional view of the direction of e-e1 shown in FIG. 2, and is formed in the adjacent spacer 52. The word line filling layer 622 between the two, the word line filling layer 622 also covers the word line barrier layer 621, and the word line barrier layer 621 and the word line filling layer 622 constitute the word line 62.

Illustratively, a low-resistance metal such as titanium, tungsten, or molybdenum is deposited between the spacers 52 as the word line filling layer 622. The low-resistance metal is beneficial to reduce the power consumption of the semiconductor structure, and is also beneficial to shorten the delay time, thereby increasing the operating speed of the semiconductor structure.

It should be noted that, since the first isolation layer 5 for isolating the adjacent word lines 62 has been formed before the word lines 62 are formed, and the spacer portion 52 is connected to the main body portion 51, the window region C can be closed toward the One side of the word line area A1, thereby avoiding interconnection of the upper and lower word lines 62.

In addition, the first isolation layer 5 also serves as a mold for forming the word lines 62. In this way, the deposition time of the word lines 62 can be extended accordingly, so that the word lines 62 fill the gaps between the adjacent spacers 52, thereby avoiding the problem of disconnection of the word lines 62 between adjacent active structures 2 of the same layer.

In addition, since the active layer 20 of the step region B is removed, a larger opening is formed between the step region B and the word line region A1. The opening can increase the contact area between the word line 62 in the step region B and the word line 62 in the word line region A1, thereby avoiding the problem of disconnection.

So far, based on the steps shown in FIGS. 26-28, a dielectric layer 61 and a word line 62 can be formed in the step region B and the word line region A1, and the dielectric layer 61 covers the active structure 2; the word line 62 covers the dielectric layer. 61, and covers the active structure 2 of the same layer, and the word line 62 is also located between adjacent spacers 52.

Figure 29:
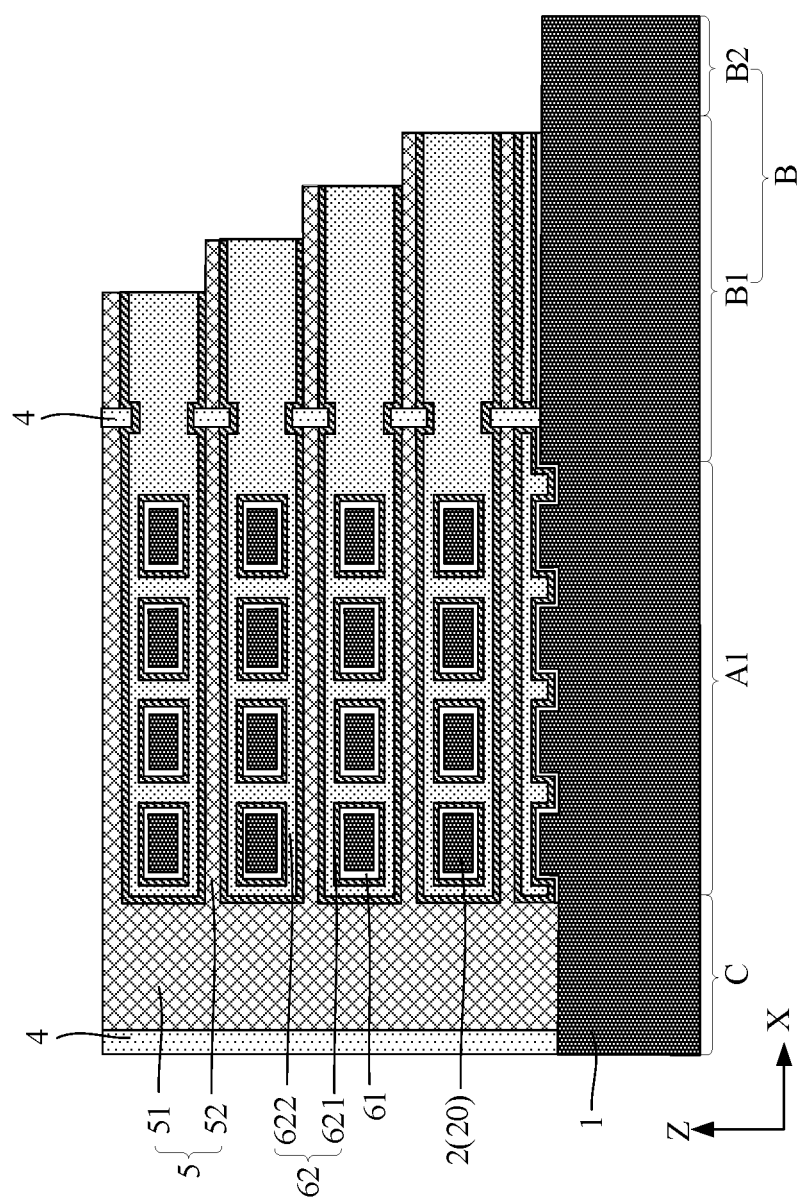

Referring to FIG. 29, FIG. 29 is a cross-sectional view along the line of d-d1 shown in FIG. 2, and the step area B is patterned to form a plurality of steps; the step includes the word line 62 and the upper and lower sides thereof. The first isolation layer 5; in the direction in which the word line area A1 points to the step area B, the height of the steps decreases sequentially. That is, the steps can provide positions for the connection pillars 63 formed subsequently, so that the connection pillars 63 lead out the word lines 62.

By way of example, part of the word lines 62 and part of the first isolation layer 5 in the step region B are etched, and the remaining word lines 62 and the first isolation layer 5 in the step region B constitute steps.

Figure 30:
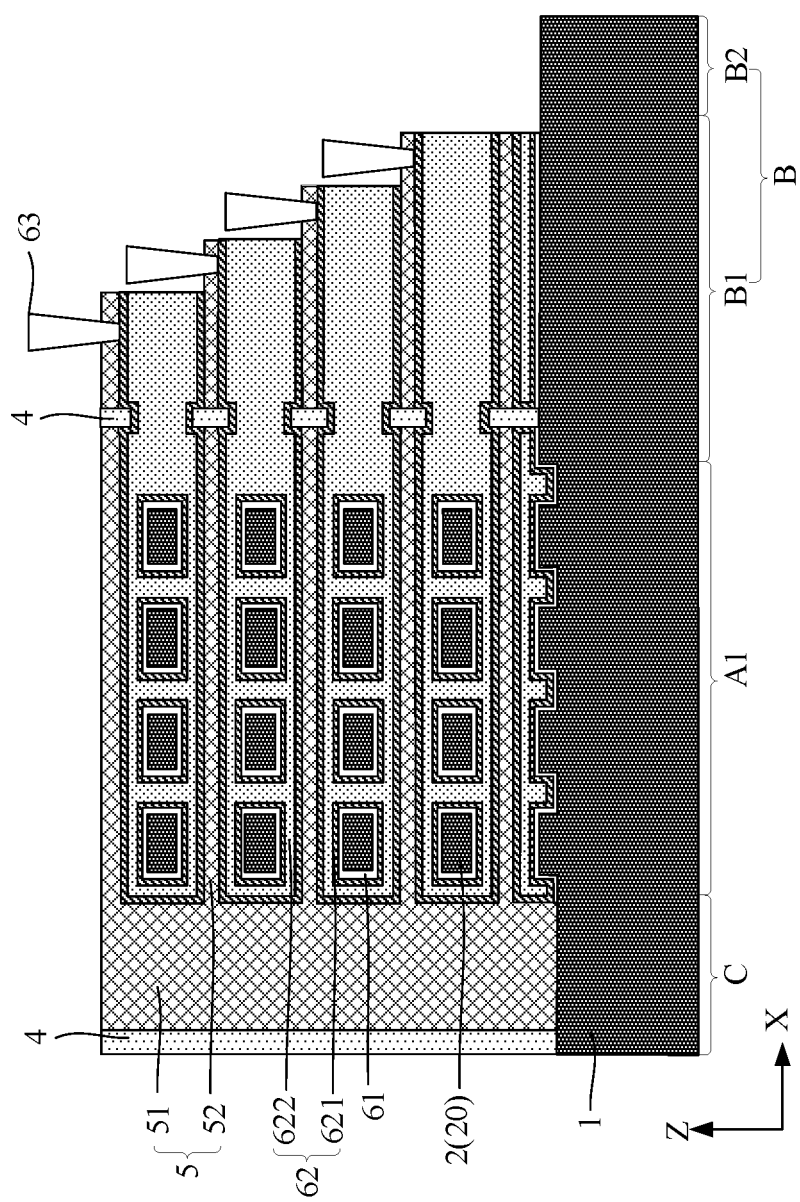

FIG. 30, a plurality of connection pillars 63 are formed, the connection pillars 63 correspond to the steps one-to-one, and penetrate the first isolation layer 5 on the word line 62, so that the connection pillar 63 is connected to the word line 62.

Before forming the connection pillars 63, a cover layer may also be formed on the steps, the cover layer may be etched to form through holes, and metals such as copper, aluminum, tungsten or titanium are deposited in the through holes as the connection pillars 63.

Referring to FIG. 2, it is worth noting that the transistor region A also includes a bit line region A2, a first interval region A3, a second interval region A4 and a capacitor region A5; the bit line region A2, the first interval region A3, the word The line area A1, the second spacer area A3 and the capacitor area A5 are arranged in sequence in the second direction Y.

The manufacturing method may also include: forming a plurality of bit lines 7 in the bit line area A2, the bit lines extending in a third direction Z, and the third direction Z is perpendicular to the surface of the substrate 1; the bit lines are electrically connected to the active structure 2. Specifically, the active structure 2 includes a first source-drain region, a channel region and a second source-drain region arranged in sequence in the second direction Y, wherein the bit line 7 is connected to the first source-drain region.

The manufacturing method may further include: forming a plurality of capacitors (not shown in the figure) in the capacitor region A5, and the capacitors are electrically connected to the active structure 2. Specifically, the capacitor is connected to the second source-drain region of the active structure 2.

In addition, a filling layer 33 is formed in the i and the second interval region, and the filling layer 33 covers the active structure 2. The fill layer 33 of the first spacer can be used to isolate the bit line 7 and the word line 62. The fill layer 33 of the second spacer can be used to isolate the word line 62 from the capacitor.

To sum up, in the embodiment of the present disclosure, the dummy word line structure 6 is first formed on the surface of the active structure 2; after the first isolation layer 5 is formed, the dummy word line structure 6 is removed, thereby obtaining a mold for forming the word line 62; Filling the conductive material in the first isolation layer 5 can form the word lines 62, so that the problem of disconnection of the word lines 62 of the same layer or interconnection of the word lines 62 of the upper and lower layers can be avoided. In addition, since the active layer 20 of the step region B is removed, the opening at the junction of the word line region A1 and the step region B is larger, so that the problem of disconnection of the word line 62 at the junction of the two regions can be avoided. In this way, it is beneficial to improve the performance of the semiconductor structure.

An embodiment of the present disclosure further provides a semiconductor structure, which can be manufactured by using the manufacturing method provided in the foregoing embodiment. For a detailed description of the semiconductor structure, reference may be made to the foregoing embodiment, which is not repeated here.

The semiconductor structure includes a window area C, a transistor area A and a step area B arranged in sequence in the first direction X, the transistor area A includes a word line area A1, and the word line area A1 is directly opposite to the window area C and the step area B and Connected, the semiconductor structure consists of:

The substrate 1, the substrate 1 of the transistor region A has active layers 20 arranged at intervals in multiple layers, the active layer 20 of the transistor region A includes a plurality of active structures 2 extending in the second direction Y, the second direction Y is perpendicular to the first direction X; the dielectric layer 61 covers the surface of the active structure 2; a plurality of word lines 62 are located in the word line area A1 and the step area B, and cover the active layer 20 of the same layer; the first isolation Layer 5, the first isolation layer 5 includes connected main body portion 51 and spacer portion 52, the main body portion 51 is located in the window region C;

It should be noted that the main body portion 51 can support the spacer portion 52, thereby improving the firmness of the first isolation layer 5. In addition, the main body portion 51 is connected with the spacer portion 52, thereby forming a plurality of relatively closed regions in the third direction Z, which can prevent the word lines 62 from being interconnected on the side far from the step region B. Therefore, the performance of the semiconductor structure is improved.

In the description of this specification, description with reference to the terms "some embodiments", "exemplarily" etc. means that a particular feature, structure, material or characteristic described in connection with the embodiment or example is included in at least one of the present disclosure examples or examples. In this specification, schematic representations of the above terms are not necessarily directed to the same embodiment or example. Furthermore, the particular features, structures, materials or characteristics described may be combined in any suitable manner in any one or more embodiments or examples. Furthermore, those skilled in the art may combine and combine the different embodiments or examples described in this specification, as well as the features of the different embodiments or examples, without conflicting each other.

Although the embodiments of the present disclosure have been shown and described above, it should be understood that the above-mentioned embodiments are exemplary and should not be construed as limitations of the present disclosure. Those of ordinary skill in the art can made changes, modifications, substitutions and alterations to the above-described embodiments within the scope of the present disclosure. So any changes or modifications made according to the claims and description of the present disclosure shall fall within the scope of the present disclosure.

The invention claimed is:

1. A method for manufacturing a semiconductor structure, wherein the semiconductor structure comprises a window region, a transistor region and a step region arranged in sequence in a first direction, wherein the transistor region comprises a word line region, wherein the word line region faces and connects the window region and the step region,
wherein the method comprises:
providing a substrate, forming a plurality of active layers arranged at intervals in the transistor region and the step region on the substrate, wherein the plurality of active layers in the transistor region comprises a plurality of active structures extending in a second direction, wherein the second direction is perpendicular to the first direction;
forming a plurality of dummy word line structures in the word line region and the step region, wherein the plurality of dummy word line structures covers the plurality of active layers disposed at a same layer;
forming a first isolation layer, wherein the first isolation layer comprises a main body part and an interval part which are connected together, wherein the main body part is located in the window region, wherein the interval part is located in the word line region and the step region and between adjacent ones of the plurality of dummy word line structures;
removing the plurality of active layers located in the step region;
removing the plurality of dummy word line structures; and
forming a dielectric layer and a plurality of word lines in the step region and the word line region,
wherein the dielectric layer covers the plurality of active structures; wherein the plurality of word lines covers the dielectric layer and covers the plurality of active structures at a same layer; and wherein the plurality of word lines each is also located between adjacent intervals.

2. The method of manufacturing the semiconductor structure according to claim 1, wherein forming the plurality of word lines comprises:
forming a word line barrier layer on surfaces of the dielectric layer and the first isolation layer;
forming a word line filling layer between adjacent intervals, wherein the word line filling layer covers the word line barrier layer, wherein the word line barrier layer and the word line filling layer constitute the plurality of word lines.

3. The method of manufacturing the semiconductor structure according to claim 1, wherein a method for forming the plurality of dummy word line structures comprises:
an atomic layer deposition process; and/or,
wherein a method for forming the first isolation layer comprise:
the atomic layer deposition process.

4. The method of manufacturing the semiconductor structure according to claim 1, wherein the transistor region further comprises a bit line region, a first interval region, a second interval region and a capacitor region; wherein the word line region, the second interval region and the capacitor region are sequentially arranged in the second direction;
wherein the method further comprises:
forming a plurality of bit lines in the bit line region, wherein the plurality of bit lines extends in a third direction, wherein the third direction is perpendicular to a surface of the substrate; wherein the plurality of bit lines are electrically connected to the plurality of active structures;
forming a plurality of capacitors in the capacitor region, wherein the plurality of capacitors are electrically connected to the plurality of active structures; and
forming a filling layer in the first interval region and a filling layer in the second interval region, wherein the filling layers covers the plurality of active structures.

5. The method of manufacturing the semiconductor structure according to claim 1, wherein in the removing the dummy word line structures, a selective etching ratio of the plurality of dummy word line structures to the first isolation layer is greater than 2:1.

6. The method of manufacturing the semiconductor structure according to claim 1, further comprising:
performing a patterning process on the step region to form a plurality of steps;
wherein the plurality of steps comprises the plurality of word lines and the first isolation layer on upper and lower sides; and
wherein heights of the plurality of steps are successively decreased in a direction in which the word line region points to the step region.

7. The method of manufacturing the semiconductor structure according to claim 6, further comprising:
forming a plurality of connection pillars, wherein the plurality of connection pillars comprises one-to-one correspondence to the plurality of steps, and wherein the plurality of connection pillars penetrates the first isolation layer on the plurality of word lines, so as to connect the plurality of connection pillars with the plurality of word lines.

8. The method of manufacturing the semiconductor structure according to claim 1, wherein the step region comprises a first region and a second region, wherein the first region is located between the word line region and the second region;
wherein before forming the plurality of dummy word line structures, the method further comprises:
forming a support structure, wherein the support structure is located at a junction of the first region and the second region, and wherein the support structure covers the plurality of active layers;
removing the plurality of active layers in the step region and the plurality of dummy word line structures, comprising:
removing the plurality of active layers, the intervals and the plurality of dummy word line structure in the second region;
removing the plurality of active layers located in the first region; and
removing remaining of the plurality of dummy word line structures.

9. The method of manufacturing the semiconductor structure according to claim 8, wherein, in the first direction, a width of the first region is greater than a width of the second region.

10. The method of manufacturing the semiconductor structure according to claim 8, wherein the support structure is also located on a side of the second region away from the first region, and covers the plurality of active layers.

11. The method of manufacturing the semiconductor structure according to claim 8, wherein the support structure is located at a junction of the word line region and the first region, and covers the plurality of active layers.

12. The method of manufacturing the semiconductor structure according to claim 8, wherein the support structure is located on opposite sides of the word line region and is arranged in the second direction, wherein the support structure covers the plurality of active structures;
wherein the support structure is also located on opposite sides of the step region arranged in the second direction; and
wherein the support structure is also located at an edge of the window region which is not in contact with the word line region.

13. The method of manufacturing the semiconductor structure according to claim 8, wherein the step of forming the plurality of active layers and the support structure comprises:
forming the plurality of active layers and sacrificial layers that are alternately arranged on the substrate;
forming a second isolation layer, wherein the second isolation layer penetrates the plurality of active layers and the sacrificial layers, so to divide the plurality of active layers of the transistor region into the plurality of the active structures; wherein the second isolation layer also fills the window region;
forming the support structure that also penetrates the second isolation layer;
after forming the support structure, removing the sacrificial layers and the second isolation layer;
forming a filling layer, which covers the plurality of active layers, wherein the filling layer is in contact with the support structure, and also fills in the window region; and
removing the filling layer from the word line region, the step region and the window region before forming the plurality of dummy word line structures.

14. The method of manufacturing the semiconductor structure according to claim 8, wherein, in the first direction, a width of the window region is greater than a width of the second region.

15. A semiconductor structure, comprising a window region, a transistor region and a step region arranged in sequence in a first direction, wherein the transistor region comprises a word line region, wherein the word line region faces and connects the window region and the step region; and
wherein the semiconductor structure further comprise:
a substrate, wherein the substrate comprise a plurality of active layers arranged at intervals in the transistor region, wherein the plurality of active layers in the transistor region comprises a plurality of active structures extending in a second direction, wherein the second direction is perpendicular to the first direction;
a dielectric layer covering a surface of the plurality of active structures;
a plurality of word lines, located in the word line region and the step region, and covering the plurality of active layers at a same layer; and
a first isolation layer, wherein the first isolation layer comprises a main body part and an interval part connected to each other, wherein the main body part is located in the window region, and wherein the interval part is located in the word line region and the step region, between adjacent ones of the plurality of word lines.

* * * * *